(12) United States Patent
Van Den Broeke et al.

(10) Patent No.: US 7,998,355 B2
(45) Date of Patent: Aug. 16, 2011

(54) CPL MASK AND A METHOD AND PROGRAM PRODUCT FOR GENERATING THE SAME

(75) Inventors: Douglas Van Den Broeke, Sunnyvale, CA (US); Kurt E. Wampler, Sunnyvale, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 891 days.

(21) Appl. No.: 11/822,538

(22) Filed: Jul. 6, 2007

(65) Prior Publication Data

US 2008/0067143 A1 Mar. 20, 2008

Related U.S. Application Data

(60) Provisional application No. 60/818,544, filed on Jul. 6, 2006.

(51) Int. Cl.
*B44C 1/22* (2006.01)
*C03C 15/00* (2006.01)

(52) U.S. Cl. .................. 216/12; 216/2; 216/11; 216/41; 216/47; 216/58; 216/72; 430/4; 430/5

(58) Field of Classification Search .................... 216/41, 216/2, 11, 12, 47, 58, 72; 430/4, 5
See application file for complete search history.

(56) References Cited

U.S. PATENT DOCUMENTS

| | | | |
|---|---|---|---|
| 5,446,521 A | | 8/1995 | Hainsey et al. |
| 5,465,859 A | * | 11/1995 | Chapple-Sokol et al. ...... 216/12 |
| 5,503,951 A | * | 4/1996 | Flanders et al. ............... 430/5 |
| 5,741,613 A | * | 4/1998 | Moon et al. ..................... 430/5 |
| 5,935,736 A | * | 8/1999 | Tzu ................................... 430/5 |
| 5,969,441 A | | 10/1999 | Loopstra et al. |
| 6,046,792 A | | 4/2000 | Van der Werf et al. |
| 6,387,787 B1 | * | 5/2002 | Mancini et al. ............... 438/586 |
| 7,338,736 B2 | * | 3/2008 | Kang et al. ........................ 430/5 |

(Continued)

FOREIGN PATENT DOCUMENTS

EP 0 679 948 A2 3/1995

(Continued)

OTHER PUBLICATIONS

Wu, Banqiu, "Photomask plasma etching: A review", Jan. 10, 2006; J. Vac. Sci. Technol. B, vol. 24, No. 1 Jan./Feb. 2006—Microelectronics and Nanometer Strucutres, pp. 1-5.* European Search Report, issued in Corresponding European Patent Application No. 07252695.7-1226, dated on Oct. 29, 2007.

*Primary Examiner* — Nadine G Norton
*Assistant Examiner* — Christopher M Remavege
(74) *Attorney, Agent, or Firm* — Pillsbury Winthrop Shaw Pittman LLP

(57) ABSTRACT

A method of generating a mask for printing a pattern including a plurality of features. The method includes the steps of depositing a layer of transmissive material having a predefined percentage transmission on a substrate; depositing a layer of opaque material on the transmissive material; etching a portion of the substrate, the substrate being etched to a depth based on an etching selectivity between the transmissive layer and the substrate; exposing a portion of the transmissive layer by etching the opaque material; etching the exposed portion of the transmissive layer so as to expose an upper surface of the substrate; where the exposed portions of the substrate and the etched portions of the substrate exhibit a predefined phase shift relative to one another with respect to an illumination signal.

16 Claims, 11 Drawing Sheets

U.S. PATENT DOCUMENTS

| | | | |
|---|---|---|---|
| 2001/0009745 A1* | 7/2001 | Kim | 430/5 |
| 2002/0058188 A1 | 5/2002 | Iwasaki et al. | |
| 2002/0136964 A1 | 9/2002 | Pierrat | |
| 2003/0152844 A1 | 8/2003 | Dulman | |
| 2004/0115539 A1 | 6/2004 | Broeke et al. | |
| 2004/0180548 A1 | 9/2004 | Tzu et al. | |
| 2004/0185348 A1* | 9/2004 | Progler | 430/5 |
| 2006/0099519 A1* | 5/2006 | Moriarty et al. | 430/5 |

FOREIGN PATENT DOCUMENTS

| | | |
|---|---|---|
| EP | 1398666 | 3/2004 |
| EP | 1491949 | 12/2004 |
| JP | 2002-156741 | 5/2002 |
| JP | 2004-151717 | 5/2004 |
| JP | 2006-504981 | 2/2006 |

* cited by examiner

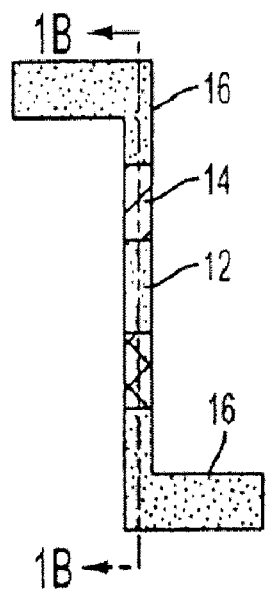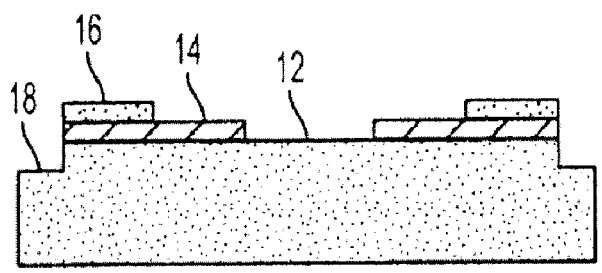
FIG. 1A    FIG. 1B
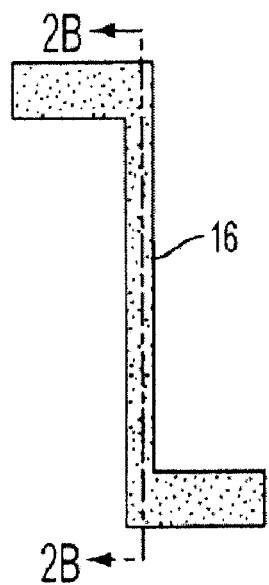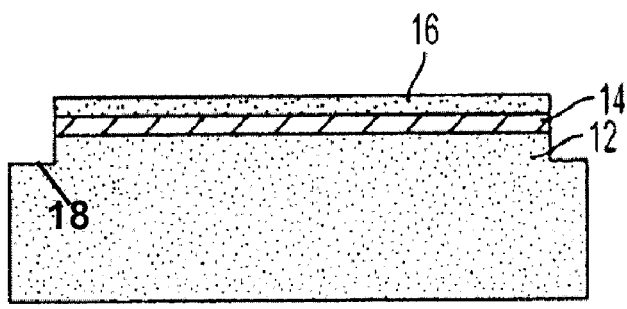
FIG. 2A    FIG. 2B

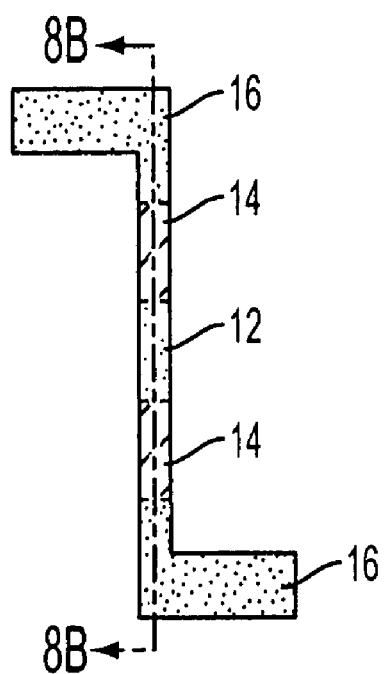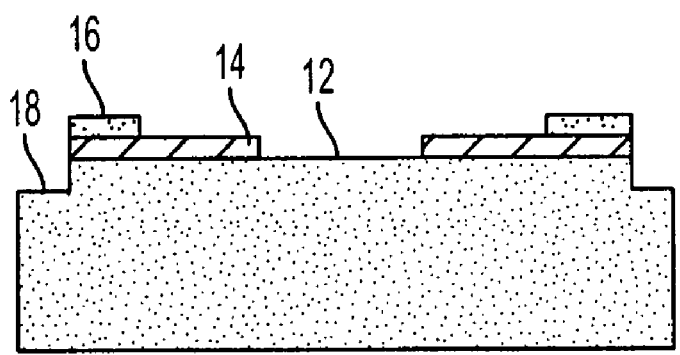
FIG. 8A                    FIG. 8B

CPL MASK AND A METHOD AND PROGRAM PRODUCT FOR GENERATING THE SAME

RELATED APPLICATIONS

This application claims priority to U.S. patent application Ser. No. 60/818,544, filed on Jul. 6, 2006, which is incorporated herein by reference in its entirety.

TECHNICAL FIELD

The present invention relates generally to the generation of mask patterns for use with chromeless phase lithography (CPL) techniques, and more specifically, for methods and techniques for improving imaging of critical features while simultaneously reducing the complexity of the mask making process required to produce masks capable of imaging such critical features.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). One technique, which is currently receiving attention from the photolithography community, for further improving the resolution/printing capabilities of photolithography equipment is referred to as chromeless phase lithography "CPL". As is known, when utilizing CPL techniques, the resulting mask pattern typically includes structures (corresponding to features to be printed on the wafer) which do not require the use of chrome (i.e., the features are printed by phase-shift techniques) as well as those that utilize chrome. Such CPL masks have been disclosed in USP Publication No. 2004-0115539 (the '539 reference), which is herein incorporated by reference in its entirety.

As discussed in the '539 reference, in the case where the CD dimension is such that the two phase-edges partially interact, these features are classified as Zone 2 features. However, the aerial images formed by the partial phase edge interaction are quite poor in quality, and therefore unusable. The '539 reference discloses that by tuning the percent transmission using chrome patches (i.e., a zebra pattern), it is possible to obtain high fidelity aerial image for such features. As a result, for the Zone 2 features imaged utilizing the zebra CPL technique, the resulting aerial image is inherently much more symmetrical near the outer sides of the group line patterns. This is one of the major benefits of using the zebra CPL techniques because a more practicable OPC treatment is feasible.

One issue with utilizing the zebra technique for implementing Zone 2 features in a mask is that such zebra mask features require the use of an e-beam or high-resolution mask making process. Borderline quality zebra mask patterns reduce effectiveness of transmission control during patterning. The zebra pattern can also cause difficulty in reticle inspection that is necessary to ensure defect free masks.

In view of the foregoing, it is therefore desirable to have an alternative to utilizing the zebra pattern to form Zone 2 features (as well as other features) in a CPL mask.

Thus, it is an object of the present invention to provide an alternative to the zebra patterning technique previously disclosed in the '539 reference, so as to provide a CPL mask which eliminates the foregoing issues associated with utilizing the zebra patterning technique.

SUMMARY OF THE INVENTION

As noted above, it is one object of the present invention to provide a method and technique for generating mask patterns capable of imaging features having critical dimensions corresponding to, for example, Zone 1 or Zone 2 features, that eliminates the need for the use of the zebra patterning technique.

More specifically, in one exemplary embodiment, the present invention relates to a method of generating a mask for printing a pattern including a plurality of features. The method includes the steps of depositing a layer of transmissive material having a predefined percentage transmission on a substrate; depositing a layer of opaque material on the transmissive material; etching a portion of the substrate, the substrate being etched to a depth based on an etching selectivity between the transmissive layer and the substrate; exposing a portion of the transmissive layer by etching the opaque material; etching the exposed portion of the transmissive layer so as to expose an upper surface of the substrate; where the exposed portions of the substrate and the etched portions of the substrate exhibit a predefined phase shift relative to one another with respect to an illumination signal.

The present invention provides one or more of the following important advantages over the prior art. Most importantly, the present invention eliminates the need to implement the zebra patterning technique, and significantly reduces the complexity of the mask making process. In addition, the present invention provides a simple process for tuning features located, for example, in a peripheral area of the circuit design to features located in a core, dense area of the circuit design, so as to allow the peripheral located features and the core features to be imaged utilizing a single illumination. Another advantage of the present invention is that it minimizes the issues associated with phase edge printing in transition regions within the circuit design. Yet another advantage of the present invention is that it overcomes the problems associated with poor etch selectivity, for example, between MoSiON based-materials and the quartz substrate, which are utilized in the mask.

As a result of the foregoing advantages, the present invention can be utilized to form a mask/reticle capable of imaging high-fidelity CPL features having variable transmission properties, that can be utilized to manufacture PSM type features such as, for example, line:space PSM features and contact holes PSM features.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

BRIEF DESCRIPTION OF THE DRAWINGS

FIG. 1 illustrates an exemplary target mask pattern of the present invention, that would be utilized in an imaging process to generate the desired feature in a substrate.

FIG. 2 illustrates a first step in the method of forming the mask in accordance with the present invention utilizing an exemplary target pattern.

FIG. 8 illustrates the resulting mask for the exemplary target pattern.

DETAILED DESCRIPTION OF THE INVENTION

Figure 3A:
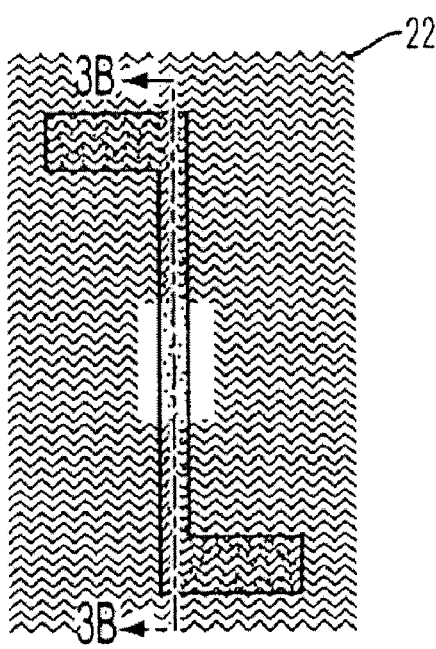
FIGS. 3-5 illustrate a second step in the method of forming the mask in accordance with the present invention utilizing an exemplary target pattern.

As explained herein, the mask and method for generating a mask in accordance with the present invention regards a new type of CPL type PSM mask that improves imaging and eliminates the need for a "zebra" pattern to control the exposure energy transmission during imaging. As explained in further detail below, the mask utilizes two films, the first of which will attenuate the impinging light to, for example, 5-12% while maintaining 0° phase shifting, and a second film that will further attenuate the impinging light to 0%. It is desirable to utilize a chrome-based film (including CrxOy) on top of a MoSiON based film formed on a quartz substrate in the mask process (it is noted that other suitable materials may also be utilized). However, when using such materials, issues arise in the manufacturing process due to the poor selectivity between MoSiON based materials and the quartz substrate. The method of the present invention also addresses this issue.

FIG. 1 illustrates an exemplary target mask pattern of the present invention, that would be utilized in an imaging process to generate the desired feature in a substrate. As shown, the mask pattern includes an un-etched quartz mesa portion 12; a transmissive portion 14 having y % transmission with zero phase shift (for example, but not limited to MoSiON); a non-transmission portion 16 (for example, but not limited to chrome); and an etched quartz portion 18, which forms the background area of the mask. It is noted that in the given example, the etched quartz portion 18 has a depth of 1920 A or 180° phase depth.

As noted above, because of poor dry etch selectivity between the transmissive portion 14 (e.g. MoSiON) and the un-etched quartz portion 12 (e.g., SiO2), a standard reticle manufacturing process would require that a perfectly aligned resist pattern be formed in order to prevent damage to a previously-imaged layer, which is typically not possible. The present invention provides a method for generating, for example, the target mask pattern of FIG. 1, which negates the problems arising from the poor etch selectivity between transmissive material 14 and the quartz substrate 12.

FIG. 2 illustrates the first step in the method of forming the mask in accordance with the present invention. Referring to FIG. 2, the substrate is initially prepared such that a layer of the zero phase, y % transmissive MoSiON material 14 is deposited over the quartz substrate 12 and a layer of chrome material 16 is deposited over the MoSiON material 14. Then a resist pattern is disposed over the chrome material 16, which exposes all of the areas of the mask in which the quartz will be etched (i.e., etched quartz portions 18). As noted above, these etched portions 18 may correspond, for example, to the background portion the mask. Next, in the exposed areas, the chrome material 16 and the MoSiON material 14 are etched, and the quartz substrate 12 in the exposed areas is etched to the target depth minus a predetermined delta, Δ, which is defined by the etch selectivity between the quartz 12 and the MoSiON material 14, and the thickness of the MoSiON film 14. Specifically, the delta is:

Δ=MoSiON film thickness×(MoSiON:quartz etch selectively).

It is noted that the etch selectivity is well known and can be readily determined once the materials being utilized for the transmissive layer 14 and the substrate 12 are identified. It is also noted that the chrome layer 16 can be utilized as a hard mask during the etching of the MoSiON layer 14 and the quartz layer 12.

As an example of the foregoing, assuming that the final/desired target etch depth (for 180° phase depth) for the background area 18 is 1920 A; the film thickness of MoSiON film 14 is 400 A; and the MoSiON:quartz etch selectivity is 0.60:1, then the Δ utilizing the foregoing formula is 400 A×(0.60/1), which equals 240 A. As such, the desired etching depth "X" of the background quartz portion 18 in this first step of the process equals 1920 A−240 A (the target depth−Δ), which is 1680 A.

Figure 3B:
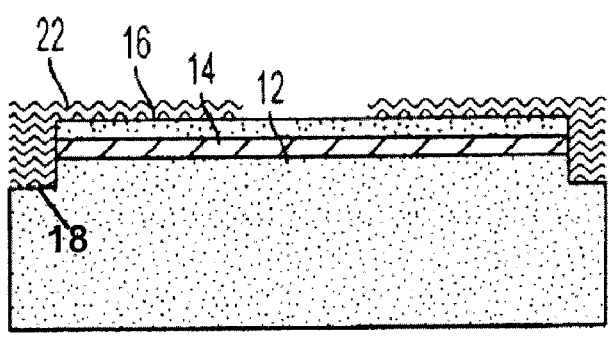
Figure 4A:
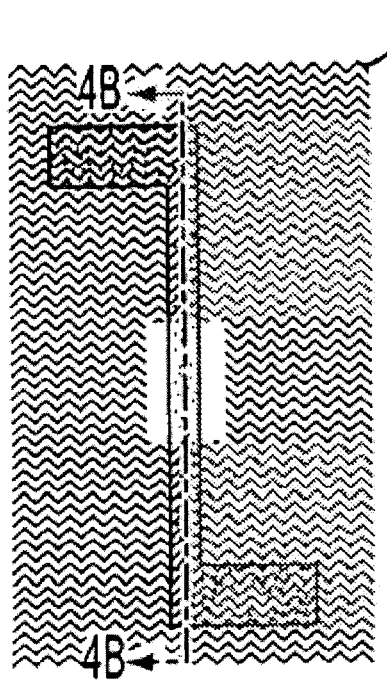
Figure 4B:
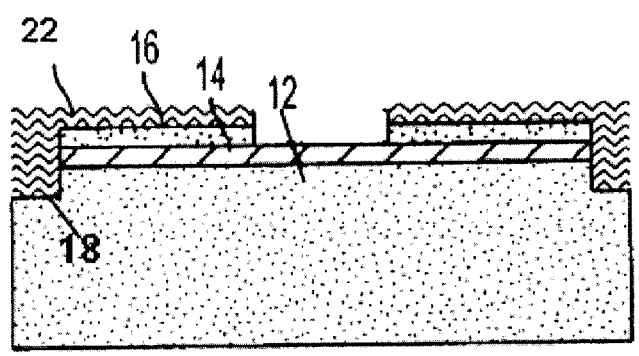
Figure 5A:
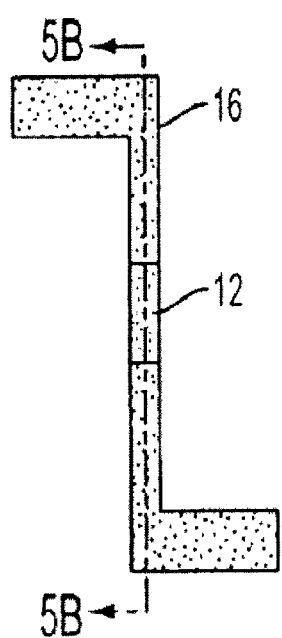
Figure 5B:
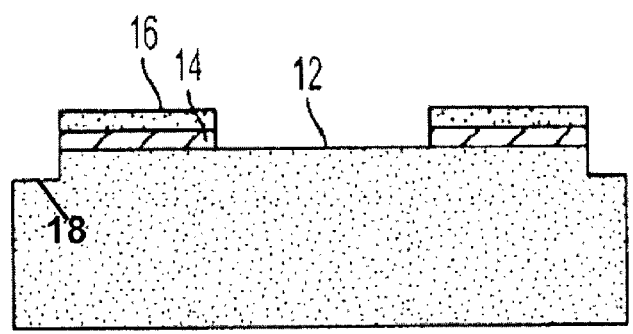

Turning to FIG. 3, the next step in the process of forming the mask is illustrated. First, utilizing standard lithography techniques, a resist pattern 22 is formed over the reticle such that it exposes all of the areas of the reticle in which it is desired to have un-etched quartz mesa structures 12. It is noted that in the preferred embodiment, the opening of the resist pattern 22 corresponding to the desired un-etched quartz mesa structures 12 are extended (i.e., made larger) than the target dimensions so as to allow for overlay errors. Once the resist pattern 22 is formed, the chrome layer 16 is etched in the openings so as to remove the chrome layer 16 in the opening as shown in FIG. 4. Next, all of the resist layer 22 is removed from the reticle. It is important that the resist layer be removed from the background areas of the reticle in which it is desired to form background quartz portions 18. Next, using the remaining chrome pattern 16 as a hard mask, the MoSiON layer 14 is etched. During this etching process, the exposed quartz areas 18 will also be etched at a rate equal to the etch selectivity ratio, MoSiON:quartz. Thus, the amount of quartz etched in the background areas 18 will be equal to Δ, making the total etch depth of the background quartz areas 18 equal to the final target etch depth (which in the given example is a 180° phase depth). The resulting reticle is illustrated in FIG. 5.

Continuing the example noted above, the etch depth of the background quartz areas 18 from step 1 is 1680 Å; the thickness of the MoSiON film is 400 Å; the MoSiON:quartz selectivity is 0.60:1; and the additional quartz etch during MoSiON etch=400 Å*(0.60/1)=240 Å. Thus, at the end of the foregoing second step in the process, the etch depth of the background quartz areas 18 equal 1680 Å+240 Å=1920 Å, which is the target design (i.e., a 180° phase depth).

Figure 6A:
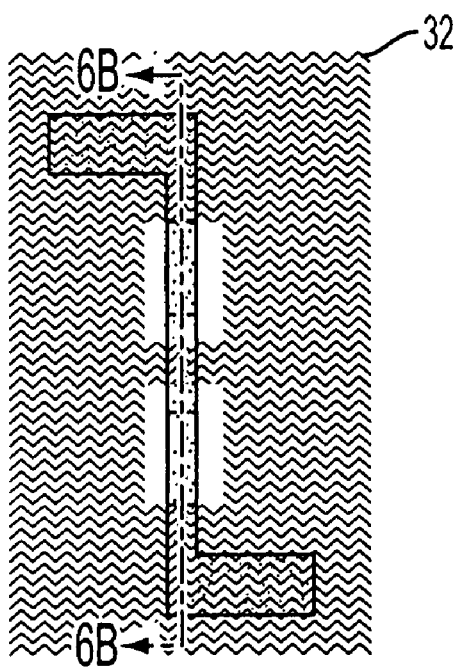
FIGS. 6 and 7 illustrates a third step in the method of forming the mask in accordance with the present invention utilizing an exemplary target pattern.
Figure 6B:
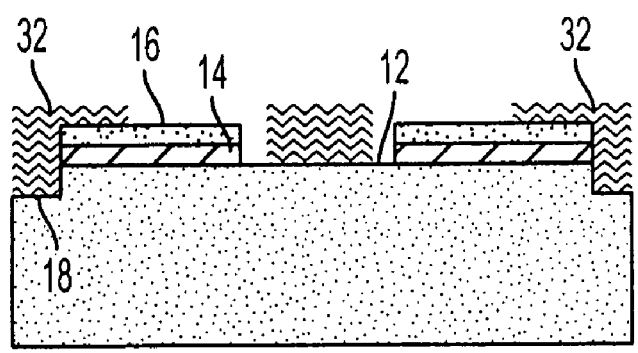
Figure 7A:
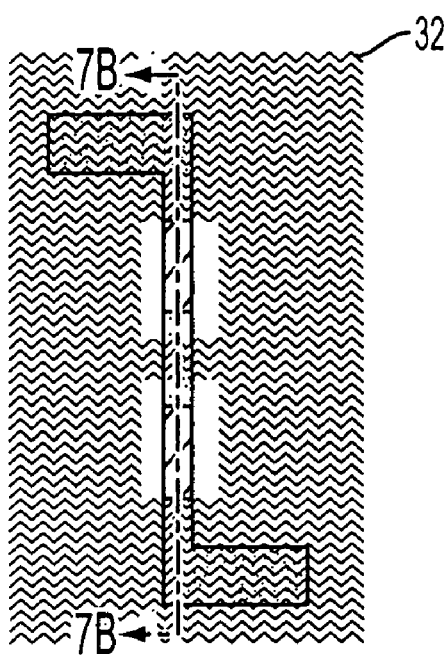
Figure 7B:
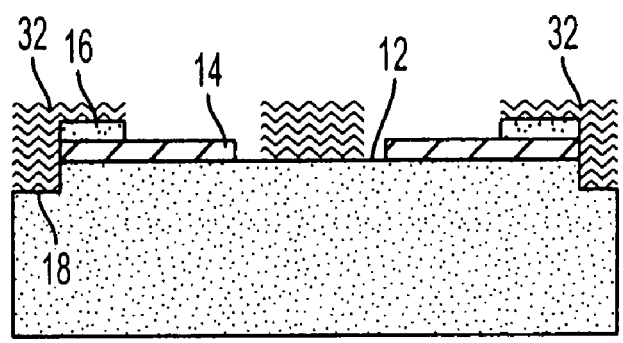

Turning to the third step in the process, which is illustrated in FIGS. 6-8, once the background quartz areas 18 are etched to the target depth, and the MoSiON layer 14 has been removed from the areas in which un-etched quartz areas 12 are to be formed, which is the result of the completion of the second step, the reticle is once again covered with a resist layer 32 to define a resist pattern that exposes all the areas of the mask that will be MoSiON structures 14 (y % transmissive, 0° phase relative to the mesa background 12, but 180° phase relative to the etched quartz areas 18). It is noted that in the preferred embodiment, the opening of the resist pattern 32 corresponding to the desired MoSiON structures 14 are extended (i.e., made larger than the target dimensions) so as to allow for overlay errors. Next, the exposed chrome pattern 16 is etched so as to remove the chrome layer 16 above the MoSiON layer 14, thereby forming y % transmissive, 0° MoSiON structures 14 in the reticle as shown in FIG. 7. Thereafter, the resist layer 32 is removed and the reticle is complete as shown, for example, in FIG. 8.

Referring to FIG. 8, it is shown in the given example that in the final reticle/mask in the given example, the MoSiON structures 14 exhibit a y % transmission, and 180° phase shift relative to the etched quartz portions 18, and the un-etched quartz portions 12 exhibit a 100% transmission with 180° phase shift relative to the etched quartz portions 18.

Figure 9A:
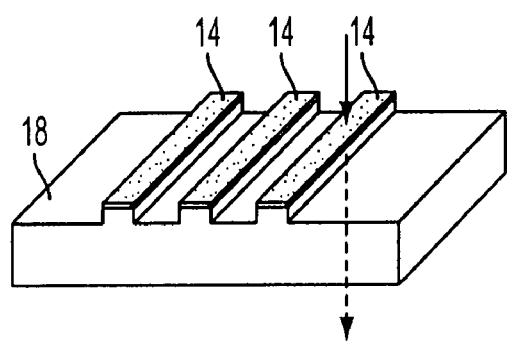
FIGS. 9a and 9b illustrate exemplary CPL type PSM masks that can be generated utilizing the process of the present invention.
Figure 9B:
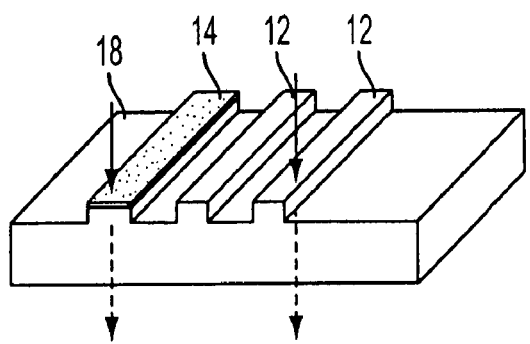
Figure 10:
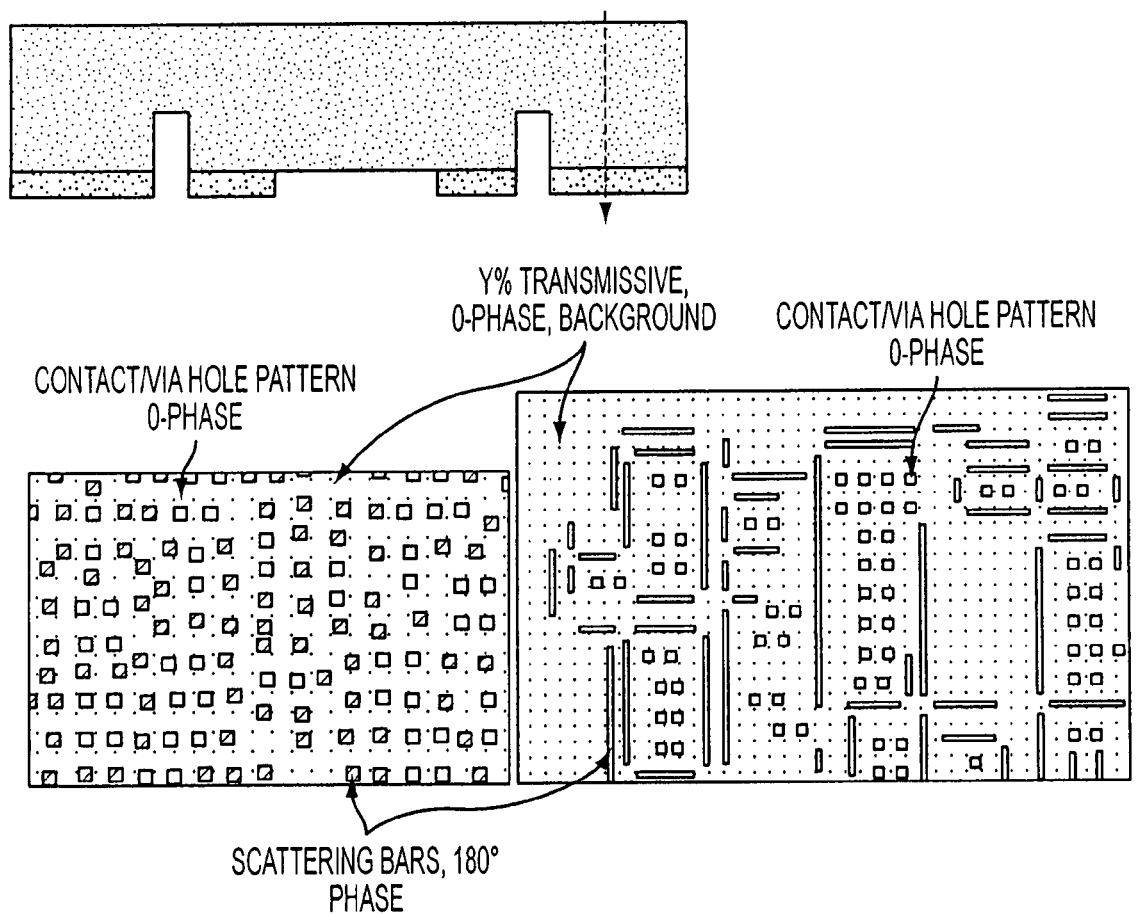
FIG. 10 illustrates an exemplary CPL type PSM contact hole pattern that can be generated utilizing the process of the present invention.

The process of forming a mask in accordance with the present invention can be utilized to form various masks capable of imaging/creating various features. For example, referring to FIGS. 9a and 9b, the process can be utilized to form a line:space pattern where each of the features (i.e., lines) to be printed comprises the y % transmission layer 14 disposed on the un-etched quartz, with the quartz areas adjacent the features being etched to a depth corresponding to a 180° phase shift in the manner noted above (see, FIG. 9a). FIG. 9b illustrates another line:space pattern in which only one of the line features includes the y % transmission layer 14 and the other two line features 95 are formed by the 100% transmissive un-etched quartz areas 12. FIG. 10 illustrates a partial mask pattern for forming contact holes with scattering bars placed adjacent to the contact hole. Once again, the process of the present invention can be utilized to form this reticle/mask. As is shown in FIG. 10, the contact hole exhibits a 180° phase shift relative to the scattering bar.

It is also noted that while the foregoing description sets forth an illustrative example of the process of the present invention, variations of the process are also possible. For example, while the illustrative example discloses using MoSiON material as the y % transmissive layer, any suitable transmissive layer may be utilized. Further, the percentage transmission of layer 14 is selected in accordance with the desired result and/or can be adjusted (for example by utilizing different materials and/or controlling the thickness of the material) as necessary to control the transmission of light to obtain the desired imaging result as may be necessary when imaging, for example, "Zone 2" features. Similarly, while chrome and quartz have been described as corresponding to the opaque layer 16 and 100% transmissive layer 14, respectively, any other suitable materials may also be substituted therefore. In addition, the depth of the etch of the substrate can be varied as necessary to obtain a phase shift other than 180° relative to the un-etched portions of the substrate, in the event a different phase shift is desirable. Further, while the foregoing example illustrates the use of the present invention in conjunction with a clear field mask, it is also applicable for use with a dark field mask, which can be utilized, for example, to form a dark field trench PSM mask.

As noted above, the present invention provides one or more of the following important advantages over the prior art. Most importantly, the present invention eliminates the need to implement the zebra patterning technique, and significantly reduces the complexity of the mask making process. In addition, the present invention provides a simple process for tuning features located, for example, in a peripheral area of the circuit design to features located in a core, dense area of the circuit design, so as to allow the peripheral located features and the core features to be imaged utilizing a single illumination. Another advantage of the present invention is that it minimizes the issues associated with phase edge printing in transition regions within the circuit design. Yet another advantage of the present invention is that it overcomes the problems associated with poor etch selectivity, for example, between MoSiON based-materials and the quartz substrate, which are utilized in the mask.

Figure 11:
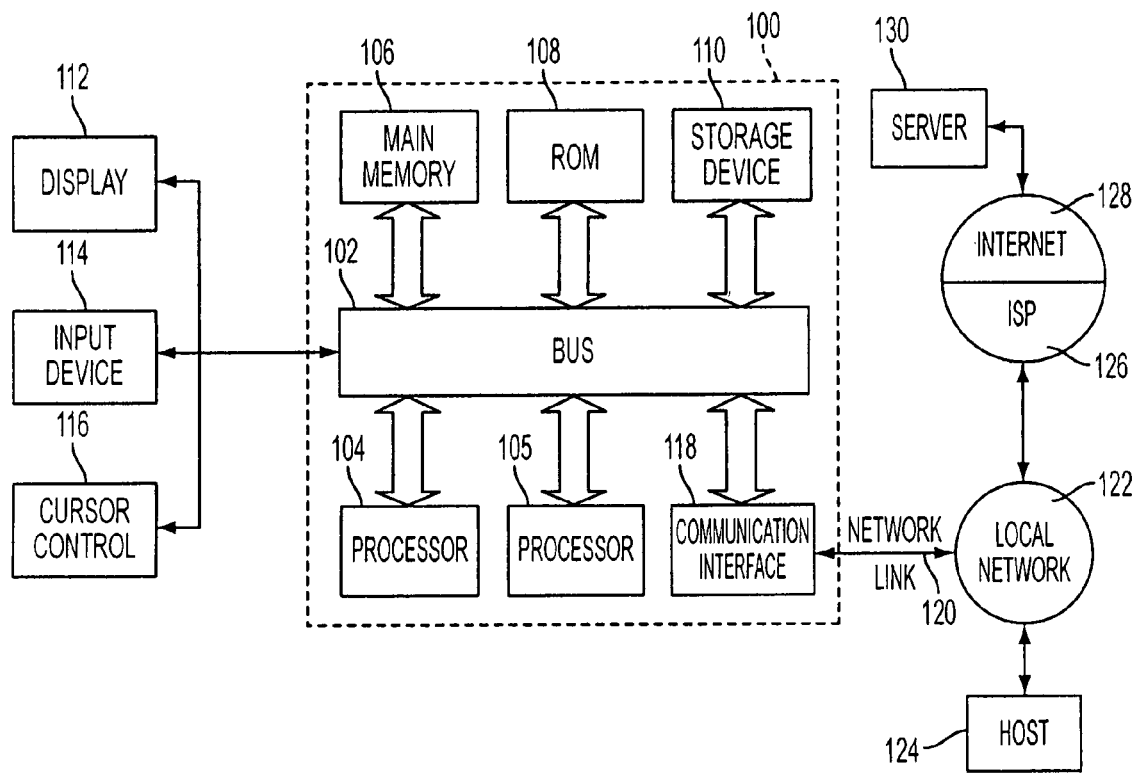
FIG. 11 is a block diagram that illustrates a computer system which can implement illumination optimization according to an embodiment of the present invention.

FIG. 11 is a block diagram that illustrates a computer system 100 which can implement the illumination optimization explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the mask design process may be aided by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 12:
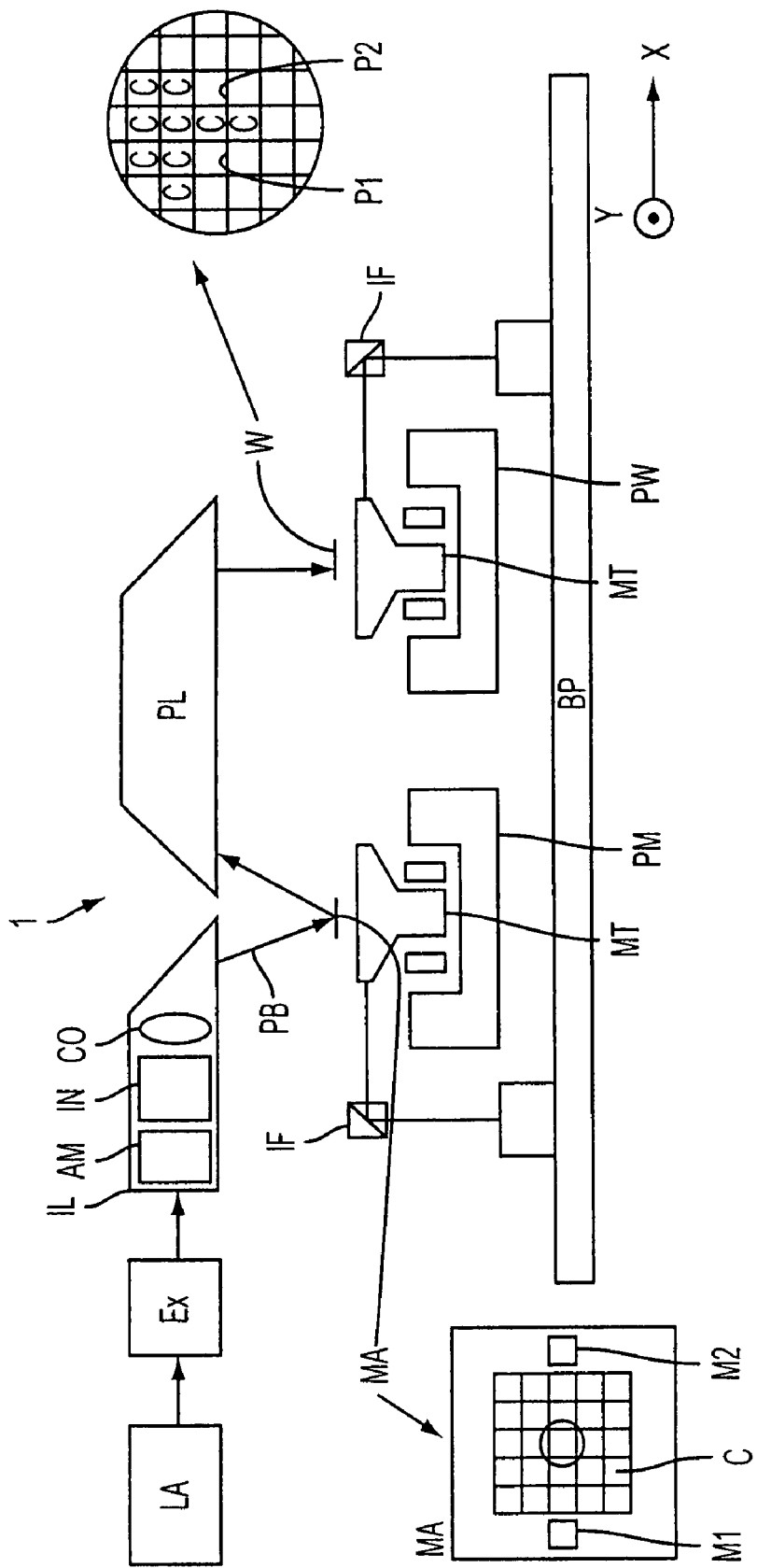
FIG. 12 schematically depicts an exemplary lithographic projection apparatus suitable for use with a mask designed with the aid of the disclosed concepts.

FIG. 12 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a mask for printing a pattern comprising a plurality of features, said method comprising the steps of:

depositing a layer of transmissive material having a predefined percentage transmission on an upper surface of a mask substrate;

depositing a layer of opaque material on said transmissive material;

etching a portion of said mask substrate to achieve a partial etching depth less than a target depth, said partial etching depth being based on an etching selectivity between said transmissive layer and said mask substrate;

exposing a portion of said patterned transmissive layer by etching said opaque material; and etching said exposed portion of said transmissive layer so as to expose a portion of said upper surface of said mask substrate from underneath the patterned transmissive layer, said etched portion of said mask substrate being further etched along with said transmissive layer, thereby achieving the target depth;

wherein said exposed portion of said upper surface of said mask substrate and said etched portion of said mask substrate further etched along with said transmissive layer exhibit a predefined phase shift relative to one another with respect to an illumination signal impinging on the mask.

2. The method of forming a mask according to claim 1, wherein said partial etching depth of said mask substrate is equal to the target depth minus a predefined delta, said predefined delta corresponding to a thickness of said transmissive layer times the etching selectivity between said transmissive layer and said mask substrate.

3. The method of forming a mask according to claim 1, wherein said layer of opaque material comprises chrome.

4. The method of forming a mask according to claim 1, wherein said transmissive layer comprises MoSiON.

5. The method of forming a mask according to claim 1, wherein said transmissive layer has a percentage transmission in the range of 5 to 12 percent.

6. The method of forming a mask according to claim 1, wherein said opaque material operates as a hard mask during the etching of said mask substrate.

7. The method of forming a mask according to claim 1, wherein said etched portion of said mask substrate forms a background portion of said mask, said background portion being a clear field.

8. A device manufacturing method comprising the steps of:
    (a) providing a chip substrate that is at least partially covered by a layer of radiation-sensitive material;
    (b) providing a projection beam of radiation using an imaging system;
    (c) forming a mask utilized to endow the projection beam with a pattern in its cross-section;
    (d) projecting the patterned beam of radiation onto a target portion of the layer of radiation-sensitive material,
    wherein, in step (c), said mask is formed by a method comprising the steps of:
    depositing a layer of transmissive material having a predefined percentage transmission on an upper surface of a mask substrate;
    depositing a layer of opaque material on said transmissive material;
    etching a portion of said mask substrate to achieve a partial etching depth less than a target depth, said partial etching depth being based on an etching selectivity between said transmissive layer and said mask substrate;
    exposing a portion of said patterned transmissive layer by etching said opaque material; and
    etching said exposed portion of said transmissive layer so as to expose a portion of said upper surface of said mask substrate from underneath the patterned transmissive layer, said etched portion of said mask substrate being further etched along with said transmissive layer, thereby achieving the target depth;
    wherein said exposed portion of said upper surface of said mask substrate and said etched portion of said mask substrate further etched along with said transmissive layer exhibit a predefined phase shift relative to one another with respect to the beam of radiation impinging on the mask.

9. The method of forming a mask according to claim 8, wherein said partial etching depth of said mask substrate is equal to the target depth minus a predefined delta, said predefined delta corresponding to a thickness of said transmissive layer times the etching selectivity between said transmissive layer and said mask substrate.

10. The method of forming a mask according to claim 8, wherein said layer of opaque material comprises chrome.

11. The method of forming a mask according to claim 8, wherein said transmissive layer comprises MoSiON.

12. The method of forming a mask according to claim 8, wherein said transmissive layer has a percentage transmission in the range of 5 to 12 percent.

13. The method of forming a mask according to claim 8, wherein said opaque material operates as a hard mask during the etching of said mask substrate.

14. The method of forming a mask according to claim 8, wherein said etched portion of said mask substrate forms a background portion of said mask, said background portion being a clear field.

15. The method of claim 8, wherein the method further comprises: in step (c), prior to the step of etching a portion of the mask substrate, patterning the layer of transmissive material and the layer of opaque material to expose the portion of the mask substrate to be etched.

16. The method of claim 1, wherein the method further comprises: prior to the step of etching a portion of the mask substrate, patterning the layer of transmissive material and the layer of opaque material to expose the portion of the mask substrate to be etched.

* * * * *